(12) United States Patent
Godycki

(10) Patent No.: US 11,038,466 B2
(45) Date of Patent: Jun. 15, 2021

(54) WIDEBAND ENVELOPE CONTROL IN POLAR MODULATORS

(71) Applicant: Eridan Communications, Inc., Santa Clara, CA (US)

(72) Inventor: Waclaw Godycki, Portland, OR (US)

(73) Assignee: Eridan Communications, Inc., Mountain View, CA (US)

(*) Notice: Subject to any disclaimer, the term of this patent is extended or adjusted under 35 U.S.C. 154(b) by 0 days.

(21) Appl. No.: 16/544,172

(22) Filed: Aug. 19, 2019

(65) Prior Publication Data

US 2021/0058035 A1 Feb. 25, 2021

(51) Int. Cl.
| | | |
|---|---|---|
| H03F 1/30 | (2006.01) | |
| H03F 1/02 | (2006.01) | |
| H03F 3/217 | (2006.01) | |
| H02M 3/158 | (2006.01) | |
| H03F 3/45 | (2006.01) | |

(52) U.S. Cl.
CPC .......... *H03F 1/0205* (2013.01); *H02M 3/158* (2013.01); *H03F 3/217* (2013.01); *H03F 3/45475* (2013.01); *H03F 2200/105* (2013.01); *H03F 2200/129* (2013.01); *H03F 2200/451* (2013.01); *H03F 2203/45116* (2013.01)

(58) Field of Classification Search
CPC ....................................................... H03F 1/30
USPC .......................................... 330/297, 296, 285
See application file for complete search history.

(56) References Cited

U.S. PATENT DOCUMENTS

| | | | | |
|---|---|---|---|---|
| 6,639,471 B2* | 10/2003 | Matsuura | ............... | H03F 1/0227 330/285 |
| 7,259,618 B2* | 8/2007 | Hand | ...................... | H03F 1/523 330/10 |
| 10,084,448 B2 | 9/2018 | Godycki | | |

OTHER PUBLICATIONS

E. McCune, Dynamic Power Supply Transmitters, 2015, Cambridge University Press, Cambridge, UK, ISBN 9781107059177.
Int'l Search Report (ISR) and Written Opinion from PCT/US20/45711.

* cited by examiner

*Primary Examiner* — Henry Choe
(74) *Attorney, Agent, or Firm* — Patent Law Professionals, P.C.; William E. Winters

(57) ABSTRACT

A wideband envelope modulator comprises a direct current (DC)-to-DC switching converter connected in series with a linear amplitude modulator (LAM). The DC-DC switching converter includes a pulse-width modulator that generates a PWM signal with modulated pulse widths representing a time varying magnitude of an input envelope signal or a pulse-density modulator that generates a PDM signal with a modulated pulse density representing the time varying magnitude of the input envelope signal, a field-effect transistor (FET) driver stage that generates a PWM or PDM drive signal, a high-power output switching stage that is driven by the PWM or PDM drive signal, and an output energy storage network including a low-pass filter (LPF) of order greater than two that filters a switching voltage produced at an output switching node of the high-power output switching stage.

14 Claims, 5 Drawing Sheets

US 11,038,466 B2

WIDEBAND ENVELOPE CONTROL IN POLAR MODULATORS

BACKGROUND OF THE INVENTION

To achieve high energy efficiency many modern radio frequency (RF) transmitters employ what is known as a "polar modulator." As illustrated in FIG. 1, the principal components of a polar modulator 100 include: a switch-mode power amplifier (SMPA) 102, a phase modulator 104, and a dynamic power supply (DPS) 106. Operating in the polar domain, the DPS 106 modulates a (DC) power supply voltage VDD(DC) by an input amplitude modulating signal AM(t), to produces a time varying DPS voltage VDD(t) that follows AM(t). Meanwhile, the phase modulator 104 modulates an RF carrier by an input phase modulating signal PM(t), to produce a phase-modulated RF carrier. The SMPA 102 serves to translate the phase-modulated RF carrier to higher RF power, so that it can then be radiated over the air to a remote receiver. The RF output power $P_{OUT}$ produced by an SMPA is proportional to the square of the magnitude of its DPS voltage, i.e., $P_{OUT} \propto VDD^2(t)$. This dependency is exploited by the polar modulator 100 to superimpose the amplitude modulation contained in the original input amplitude modulating signal AM(t) onto SMPA's 102's RF output $RF_{OUT}$. In other words, as the SMPA 102 translates the phase-modulated RF carrier to higher RF power, it also modulates the RF output $RF_{OUT}$ by the AM carried by the DPS voltage VDD(t) to produce a final phase-modulated RF output $RF_{OUT}$ having a 'signal envelope' that follows the original input amplitude modulating signal AM(t).

Although RF transmitters constructed from polar modulators can be made to operate with high energy efficiencies, one problem that arises from operating in the polar domain is that the bandwidth of the amplitude modulating signal AM(t) can be high, depending on the modulation scheme being used. For example, the modulation schemes used in Wideband Code Division Multiple Access (W-CDMA) and Long-Term Evolution (LTE) systems produce amplitude modulating signals AM(t) that tend to inflect abruptly when traversing to and from zero magnitude. As illustrated in FIG. 2, these sharply inflecting low-magnitude events 202 have substantial high frequency content, so when represented in the frequency domain are seen to have a very wide bandwidth. In order to accurately reproduce the low-magnitude events in the signal envelope of the RF output $RF_{OUT}$, the DPS 106 must therefore have a wide operating bandwidth capability, preferably at least 5× to 10× the modulated signal bandwidth. Unfortunately, a conventional DPS lacks this capability. It would be desirable, therefore, to have a polar modulator with a DPS that is capable of operating over a wide envelope bandwidth. It would be further desirable to have a DPS that has that same capability and that also operates with high energy efficiency.

BRIEF SUMMARY OF THE INVENTION

A wideband envelope modulator for a polar modulator is disclosed. The wideband envelope modulator comprises a direct current (DC)-to-DC switching converter connected in series with a linear amplitude modulator (LAM). The DC-DC switching converter includes a pulse-width modulator that generates a PWM signal with modulated pulse widths representing a time varying magnitude of an input envelope signal or a pulse-density modulator that generates a PDM signal with a modulated pulse density representing the time varying magnitude of the input envelope signal, a field-effect transistor (FET) driver stage that generates a PWM or PDM drive signal, a high-power output switching stage that is driven by the PWM or PDM drive signal, and an output energy storage network including a low-pass filter (LPF) of order greater than two that filters a switching voltage produced at an output switching node of the high-power output switching stage. In a preferred embodiment of the invention the DC-DC switching converter is configured to operate open loop, so that the frequency response of the DC-DC switching converter remains uncompromised, and the LAM comprises a gallium nitride high electron mobility transistor (GaN HEMT) pass transistor controlled by a silicon-opamp error amplifier, which together allow the LAM to realize an operating bandwidth in excess of 900 MHz.

Further details of the invention, including a detailed description of the above-summarized and other exemplary embodiments of the invention, will now be described with reference to the accompanying drawings, in which like reference numbers are used to indicate identical or functionally similar elements.

DETAILED DESCRIPTION

Figure 1:
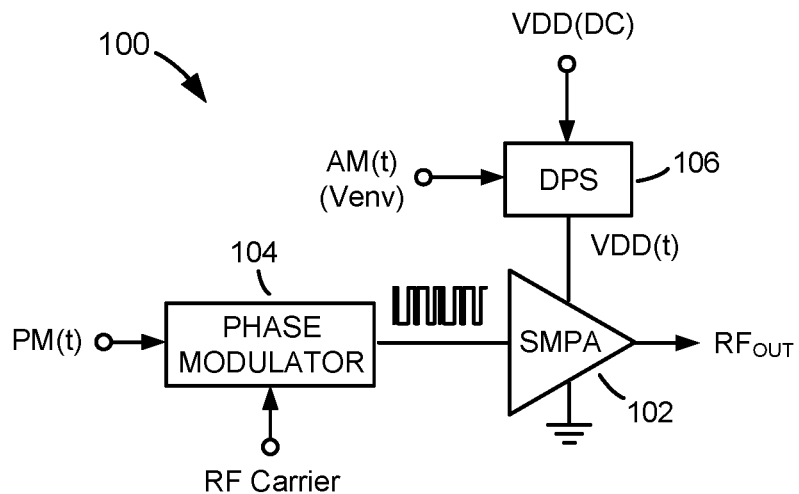
FIG. 1 is a simplified drawing of a conventional polar modulator, highlighting its principal components.
Figure 2:
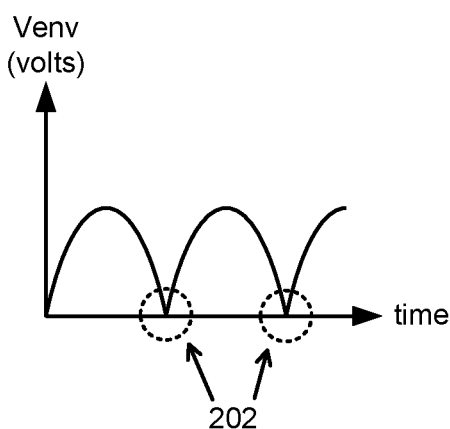
FIG. 2 is a signal diagram of an amplitude modulating signal AM(t), illustrating how abrupt changes in its waveform result in high frequency content.
Figure 3:
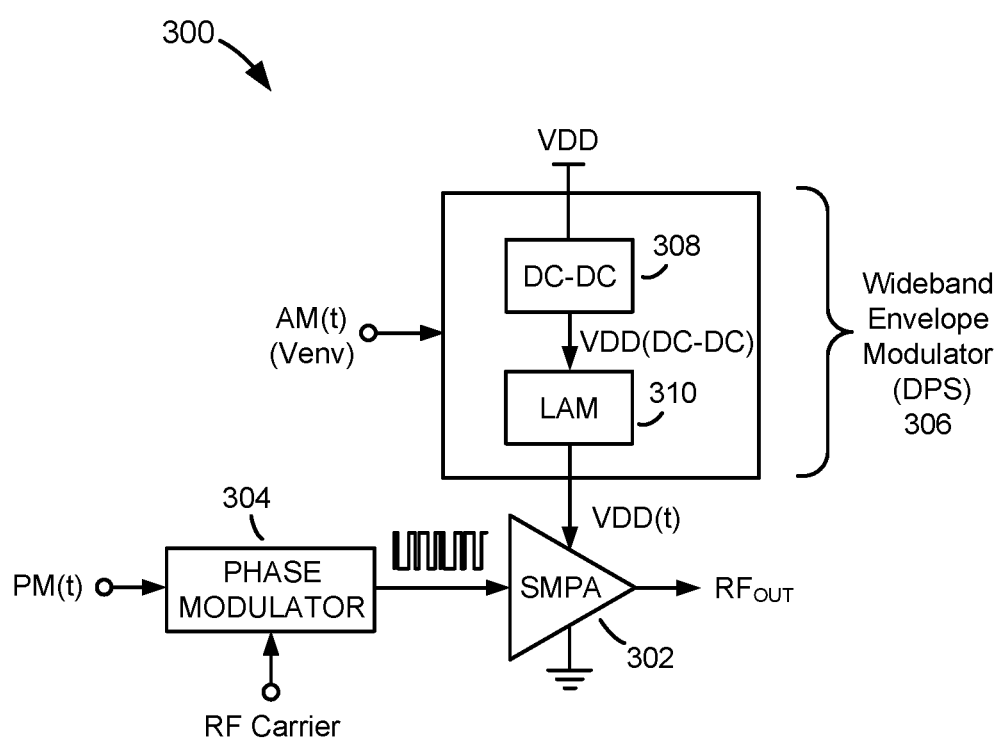
FIG. 3 is drawing depicting a polar modulator with a wideband envelope modulator, according to one embodiment of the present invention.

Referring to FIG. 3, there is shown a polar modulator 300 according to one embodiment of the present invention. The polar modulator 300 comprises a switch-mode power amplifier (SMPA) 302, a phase modulator 304, and a dynamic power supply (DPS) 306 that includes a direct-current (DC)-to-DC switching converter 308 connected in series with a linear amplitude modulator (LAM) 310. In the description below, the DPS 306 is also referred to as the "series envelope modulator" 306. Because of its ability to operate over a wide frequency range, it may also be referred to as the "wideband envelope modulator" 306. Similar to as in the conventional polar modulator 100, the phase modulator 304 in the polar modulator 300 serves to modulate an RF carrier by an input phase modulating signal PM(t), to produce a phase-modulated RF carrier, and the SMPA 102 serves to translate the phase-modulated RF carrier to higher RF power. However, unlike the conventional polar modulator 100, the polar modulator 300 includes the series envelope modulator 306, which, for reasons that will become more clear from the detailed description that follows, allow it to achieve a wide output dynamic range and operate with high energy efficiency over a wide frequency range.

Figure 4:
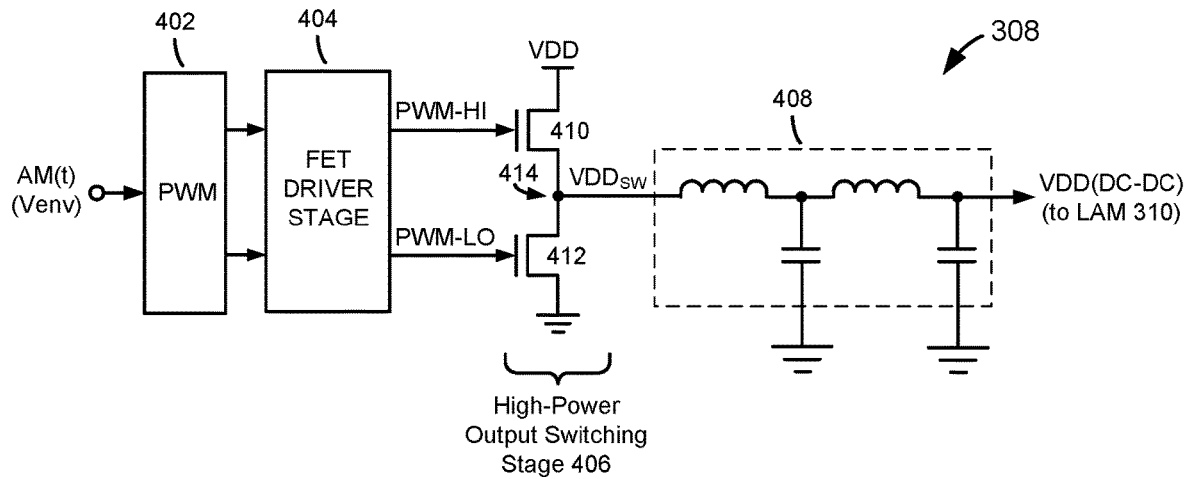
FIG. 4 is drawing showing in more detail the DC-DC switching converter of the wideband envelope modulator of the polar modulator depicted in FIG. 3, in accordance with one embodiment of the invention.

FIG. 4 is a drawing illustrating how the DC-DC switching converter 308 is constructed in one embodiment of the invention. The DC-DC switching converter 308 comprises a pulse-width modulator (PWM) 402 (or, alternatively, a pulse-density modulator (PDM)), a FET driver stage 404, a high-power output switching stage 406, and an energy storage network 408 which is shown being implemented using a fourth-order output low-pass filter (LPF) having a two-section ladder topology. The PWM 402 generates PWM signals having pulse widths that are varied depending on the magnitude of the input amplitude modulating signal AM(t), or, in embodiments of the invention in which a PDM is employed, the PDM signals having a pulse density that varies over time depending on the time varying magnitude of the input amplitude modulating signal AM(t). Note that in the description of the particular exemplary embodiment of the invention below it is assumed that a PWM is used, but with the understanding that the invention is not limited to PWM and that in other embodiments of the invention a PDM is used, instead.

The PWM signals from the PWM 402 are coupled to the FET driver stage 404, which generates therefrom PWM drive signal PWM-HI and PWM-LO for driving the high-power output switching stage 406. More specifically, the PWM drive signal PWM-HI switches a high-side FET 410 in the high-power output switching stage 406 ON and OFF and the PWM drive signal PWM-LO drives a low-side FET 412 ON and OFF, according to the modulated pulse widths in the two drive signals. As will be understood by those of ordinary skill in the art, since the PWM drive signals PWM-HI and PWM-LO are complementary, i.e., 180 degrees out of phase, the high-side FET 410 is ON while the low-side FET 412 is OFF and vice versa. The switching voltage $VDD_{SW}$ produced at the output switching node 414 of the high-power output switching stage 406 is filtered through the energy storage network 408 to produce a final DC-DC switching converter output voltage VDD(DC-DC) that generally follows the input amplitude modulating signal AM(t) and that has a cycle-by-cycle average proportional to the product of the duty cycle D(t) of the input PWM and input DC voltage VDD, i.e., VDD(SW)∝D(t)×VDD, where $T=1/f_{SW}$ is the period of the PWM switching frequency $f_{SW}$ and $D(t)=t_{ON}(t)/T$ is the fraction of time in a given period the high-side FET 410 is switched ON.

Figure 5:
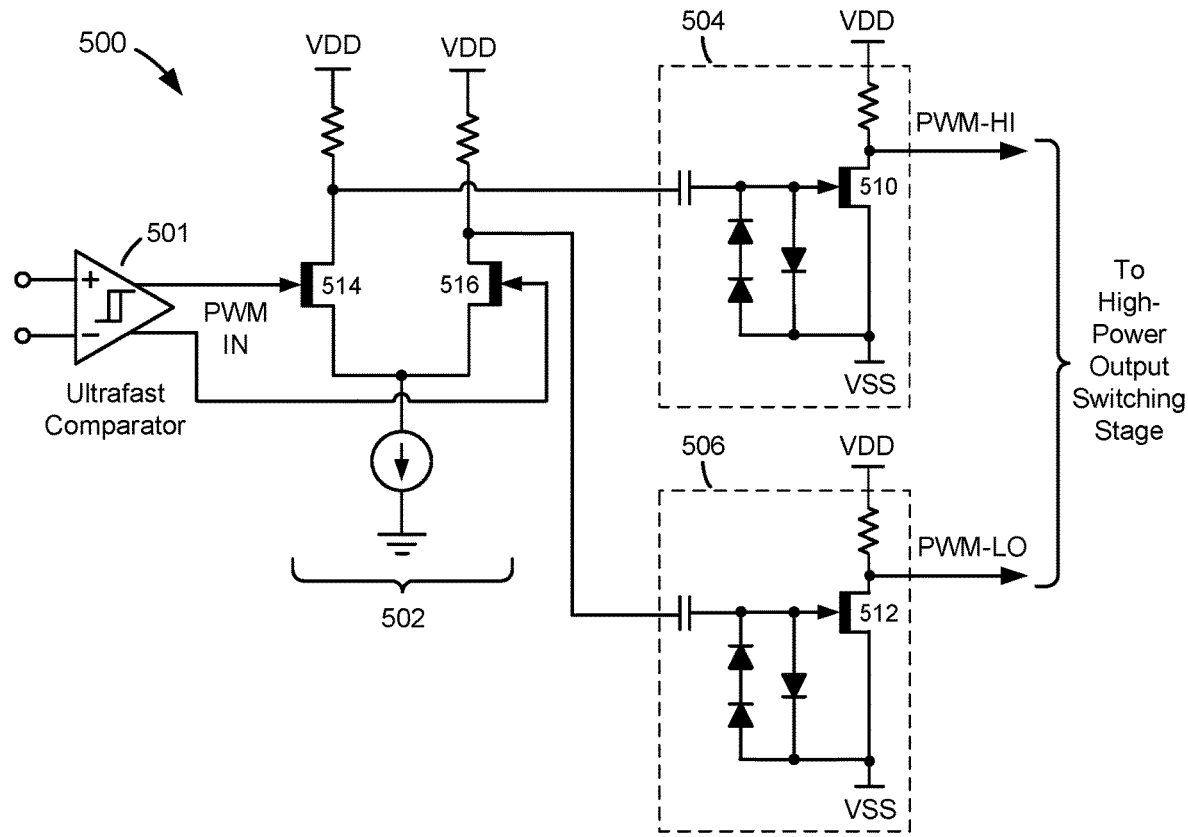
FIG. 5 is a drawing illustrating one way the FET driver stage of the DC-DC switching converter depicted in FIG. 4 is implemented in one embodiment of the invention.

FIG. 5 is schematic drawing illustrating how the FET driver stage 404 of the DC-DC switching converter depicted in FIG. 4 is implemented in one embodiment of the invention. The FET driver stage 500 includes an ultrafast comparator 501, a high-gain differential pair 502, and first and second drive interfaces 504 and 506. An input differential PWM signal produced by the ultrafast comparator 501 is DC coupled to the high-gain differential pair 502, which amplifies the signal to increase its peak-to-peak voltage swing.

Figure 6:
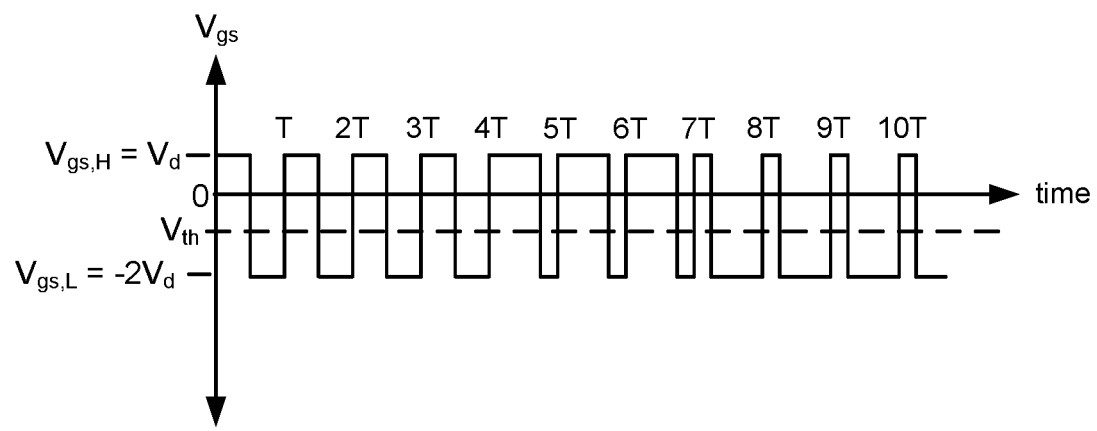
FIG. 6 is a signal diagram illustrating how the diodes in each of the drive interfaces in the FET drive stage depicted in FIG. 5 operate to clamp the input PWM waveform between a fixed input-high drive level $V_{gs,H}$ and a fixed input-low level $V_{gs,L}$.

The first and second drive interfaces 504 and 506 each includes an AC coupling capacitor, which removes the DC component from the PWM signal it receives from the high-gain differential pair 502, and diodes that clamp the input-high and input-low drive levels so that they always fall within the acceptable input-high and input-low drive ranges of the drive interface FETs 510 and 512. In one embodiment of the invention, the high-gain differential pair 502, first driver interface 504, and second driver interface 506 are integrated in a gallium nitride (GaN) integrated circuit (IC) chip and the drive interface FETs 510 and 512 and differential pair FETs 514 and 516 comprise gallium nitride high electron mobility FETs (GaN HEMTs). GaN HEMTs are depletion mode FETs, i.e., 'normally ON' FETs having a negative threshold voltage Vth, meaning that a gate-source voltage $V_{gs}$ less than (i.e., more negative than) the threshold voltage Vth must be applied across their gate-source terminals in order to turn them OFF. The clamping diodes in the first and second drive interfaces 504 and 506 ensure that happens. For example, for an input PWM signal having a peak-to-peak voltage swing greater than or equal to 4Vd (where Vd represents one forward diode voltage drop) and a source bias voltage VSS=−Vd, the diodes connected across the gate-source terminals of the drive interface FET 510 and 512 would each clamp their gate-source voltage $V_{gs}$ between an input-high drive level $V_{gs,H}$=+Vd and an input-low drive level $V_{gs,L}$=−2Vd, i.e., −2Vd<Vgs<+Vd, which is suitable for switching GaN HEMTs 510 and 512 with a threshold voltage Vth not less than (i.e., not more negative than) −2Vd fully ON and fully OFF, as illustrated in FIG. 6.

It should be mentioned that the FET driver stage 500 is designed so that it does not require a transformer balun to distribute the input differential PWM signal from the ultrafast comparator 501 on-chip to the GaN FET driver IC. The output peak-to-peak voltage swing of readily available ultrafast silicon comparators is typically limited to less than 1Vpp but 3Vpp or more is needed to switch the GaN HEMTs 510 and 512 in the driver interfaces 504 and 506 between fully ON and fully OFF states. Although a transformer balun could be used to step up the limited voltage swing provided by the ultrafast comparator 501 to the desired 3Vpp swing, it is difficult to establish and maintain a symmetric drive signal when using a transformer balun. Symmetric drive signals are desired since they preserve PWM and PDM signal quality. The high-gain differential pair 502 and driver interfaces 504 and 506 are able to provide this symmetric drive capability without difficulty. Furthermore, because the high-gain differential pair 502 does not require precise DC biasing, the input PWM signal provided by the ultrafast comparator 501 can also be directly connected to (i.e., DC coupled to) the high-gain differential pair 502. The FET driver approach depicted in FIG. 5 is therefore preferred since it obviates the need for a transformer balun. In addition to freeing up valuable printed circuit board real estate that would otherwise be occupied by the transformer balun, obviating the need for the transformer balun has the benefit of increasing the realizable controlled output voltage range from the DC-DC switching converter 308, originally near to 20% to 80% of VDD and now up and beyond 10% to 90% of VDD. This is the result of the DC-DC switching converter 308 being able to realize a 10% to 90% or wider useful duty cycle range, whereas a driver approach that employs a transformer balun is only capable of realizing, at most, a 20% to 80% useful duty cycle range.

Figure 7:
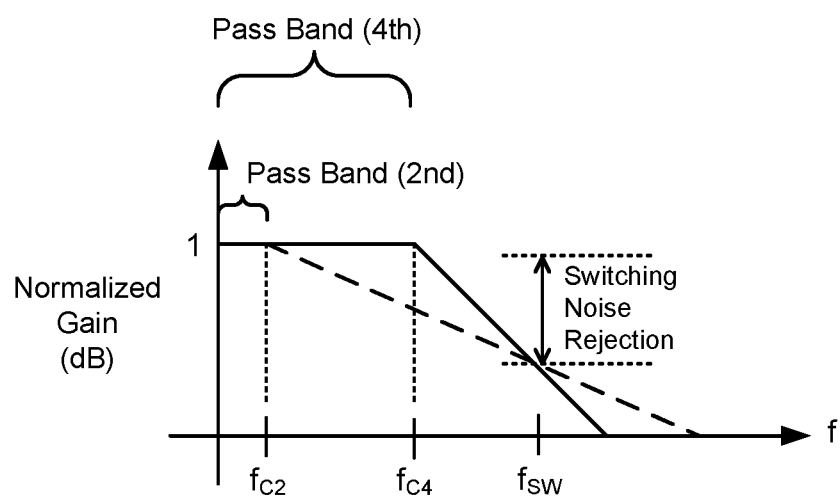
FIG. 7 is a frequency response diagram illustrating how the fourth-order low-pass filter (LPF) in the output energy storage network of the DC-DC switching converter depicted in FIG. 4 provides the DC-DC switching converter the ability to achieve a significantly wider output dynamic frequency response compared to if it employed only a second-order filter with the same switching noise suppression.

In addition to helping recover the signal envelope from the switch voltage produced at the output switching node 414, the energy storage network 408 of the DC-DC switching converter 308 serves to filter out switching noise and reduce ripple in the DC-DC switching converter output voltage VDD(DC-DC). As illustrated in FIG. 7, when the energy storage network 408 is implemented to include a fourth-order LPF the DC-DC switching converter 308 is able to realize a significantly wider output dynamic frequency response, compared to if a second-order filter with the same switching noise suppression were to be used. To ensure that this frequency response is not compromised and to avoid any possibility of feedback stability problems, in one embodiment of the invention the DC-DC switching converter 308 is configured to operate open loop, i.e., without any feedback. It should be emphasized, however, that the DC-DC switching converter 308 can be operated closed loop so long as a compromise in bandwidth is acceptable. It should also be emphasized that whereas the LPF in the energy storage network 408 preferably comprises a fourth-order LPF, any LPF of order greater than two (e.g., a third-order LPF) could be conceivably used to effectively increase the dynamic frequency response of the DC-DC switching converter 308.

Figure 8:
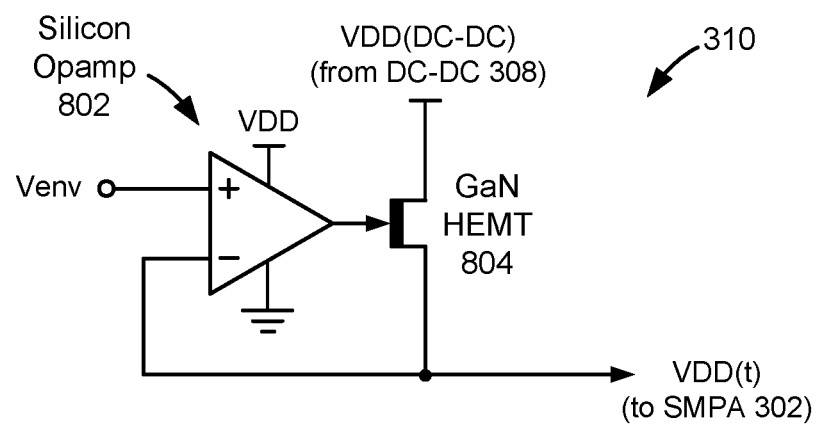
FIG. 8 is a drawing showing one way that the linear amplitude modulator (LAM) in the wideband envelope modulator of the polar modulator depicted in FIG. 3 is constructed in one embodiment of the invention.

The LAM 310 is responsible for removing any remaining ripple and residual switching noise that may be present in the bucked DC-DC voltage VDD(DC-DC). In a preferred embodiment of the invention the LAM 310 comprises a linear regulator having a silicon opamp 802 and GaN HEMT 804, as shown in FIG. 8. The silicon opamp 802 serves as an error amplifier that constantly adjusts its output voltage so that the voltage at its inverting input terminal equals the magnitude of the envelope signal applied to its non-inverting input. Using its built-in power supply rejection capability, the LAM 310 filters the DC-DC voltage VDD(DC-DC) supplied to it from the DC-DC switching converter 308, to produce the final DPS voltage VDD(t) for the SMPA 302. The silicon opamp 802/GaN HEMT 804 combination results in the LAM 310 being capable of achieving an operating bandwidth of 900 MHz, i.e., nearly 1 GHz. This bandwidth is nearly 10× greater than if the LAM was made only from silicon semiconductor devices.

While various embodiments of the present invention have been presented, they have been presented by way of example and not limitation. It will be apparent to persons skilled in the relevant art that various changes in form and detail may be made to the exemplary embodiments without departing from the true spirit and scope of the invention. For example, while the exemplary DPS 306 described above is well suited to serve as a wideband envelope modulator in a polar modulator, it may also serve as the DPS in envelope tracking (ET) amplifier that employs a linear PA and that exploit the DPS to force the linear PA to always operate near saturation, where it is most energy efficient. Accordingly, the scope of the invention should not be limited by the specifics of the exemplary embodiments of the invention but, instead, should be determined by the appended claims, including the full scope of equivalents to which such claims are entitled.

What is claimed is:

1. A wideband envelope modulator, comprising:
a direct current (DC)-to-DC switching converter including a pulse-width modulator configured to generate a PWM signal with modulated pulse widths representing a time varying magnitude of an input envelope signal or a PDM signal having a time varying pulse density representing the time varying magnitude of the input envelope signal, a driver stage configured to generate a PWM or differential PDM drive signal, a high-power output switching stage configured to be driven by the PWM or PDM drive signal, and a low-pass filter (LPF) configured to filter a switching voltage produced at an output switching node of the high-power output switching stage; and
a linear amplitude modulator (LAM) connected in series with the DC-DC switching converter, the LAM including an opamp having a first input configured to receive the input envelope signal, and a power transistor having a gate or a base coupled to the output of the opamp and a drain-source or a collector-emitter path configured between an output of the DC-DC switching converter and a wideband envelope modulator output that supplies a final dynamic power supply voltage VDD(t).

2. The wideband envelope modulator of claim 1, wherein the DC-DC switching converter is configured to operate open loop.

3. The wideband envelope modulator of claim 1, wherein the driver stage comprises:
a high-gain differential amplifier configured to amplify an input differential PWM signal or input PDM signal; and
a drive interface configured to receive an amplified PWM signal or amplified PDM signal from the high-gain differential amplifier, the driver interface including an alternating current (AC) coupling capacitor configured to remove a DC component from the amplified PWM signal, a depletion mode field-effect transistor (FET), and clamping diodes that clamp the AC-coupled and amplified PWM signal or amplified PDM signal between an input-high drive level $V_{gs,H}$ and an input-low drive level $V_{gs,L}$ appropriate for switching the driver interface depletion mode FET between fully ON and fully OFF states.

4. The wideband envelope modulator of claim 3, wherein the input differential PWM or PDM signal is DC coupled to the differential input of the high-gain differential amplifier.

5. The wideband envelope modulator of claim 1, wherein the power transistor comprises a gallium nitride high electron mobility transistor (GaN HEMT) and the opamp comprises a silicon opamp.

6. The wideband envelope modulator of claim 2, wherein the DC-DC switching converter has a 10% to 90% or wider useful duty cycle range.

7. An apparatus, comprising:
a phase modulator configured to modulate a radio frequency (RF) carrier by a phase modulating signal PM(t) and produce a phase-modulated RF carrier;
a dynamic power supply (DPS) configured to generate a wideband dynamic power supply (DPS) voltage VDD(t) from an input direct current (DC) voltage VDD and an input envelope signal, said DPS including a DC-to-DC switching converter connected in series with a linear amplitude modulator (LAM), the DC-DC converter including a driver stage configured to generate a PWM drive signal having pulse widths that vary over time according to a time varying magnitude of the input envelope signal or a PDM drive signal having a pulse density that varies over time according to the time varying magnitude of the input envelope signal, a high-power output switching stage configured to be driven by the PWM drive signal or PDM drive signal, and an output energy storage network including a low-pass filter (LPF); and
a power amplifier (PA) having an RF input port configured to receive the phase-modulated RF carrier, a power supply port configured to receive the wideband DPS voltage VDD(t) from the DPS, and an RF output that provides a final amplitude- and phase-modulated RF carrier suitable for transmitting over the air to a remote receiver, wherein the driver stage of the DC-DC converter comprises a high-gain differential amplifier configured to amplify an input differential PWM signal or input PDM signal, and a drive interface configured to receive an amplified PWM signal or amplified PDM signal from the high-gain differential amplifier, the driver interface including an alternating current (AC) coupling capacitor configured to remove a DC component from the amplified PWM signal or amplified PDM signal, a depletion mode FET, and clamping diodes that clamp the AC-coupled and amplified PWM or PDM signal between an input-high drive level $V_{gs,H}$ and an input-low drive level $V_{gs,L}$ appropriate for switching the depletion mode FET between fully ON and fully OFF states.

8. The apparatus of claim 7, wherein the input differential PWM signal or input PDM signal is DC coupled to the differential input of the high-gain differential amplifier.

9. The apparatus of claim 7, wherein the LAM comprises:
an opamp having a first input terminal configured to receive the input envelope signal; and
a power transistor having a gate or a base coupled to an output of the opamp, and a drain-source or collector-emitter path configured between an output of the DC-DC switching converter and the power supply port of the PA.

10. The apparatus of claim 9, wherein the power transistor comprises a gallium nitride high electron mobility transistor (GaN HEMT) and the opamp comprises a silicon opamp.

11. The apparatus of claim 7, wherein the DC-DC switching converter is configured to operate open loop.

12. The apparatus of claim 7, wherein the DC-DC switching converter has a 10% to 90% or wider useful duty cycle range.

13. The wideband envelope modulator of claim 1, wherein the LPF comprises and LPF of order greater than two.

14. The apparatus of claim 7, wherein the LPF comprises an LPF of order greater than two.

* * * * *